（12） United States Patent
Kanaya et al.

(10) Patent No.: US 7,894,167 B2
(45) Date of Patent: Feb. 22, 2011

(54) THIN-FILM MAGNETIC HEAD WITH LITTLE REATTACHMENT

(75) Inventors: Takayasu Kanaya, Chuo-ku (JP); Kazuki Sato, Chuo-ku (JP); Daisuke Miyauchi, Chuo-ku (JP)

(73) Assignee: TDK Corporation, Tokyo (JP)

( * ) Notice: Subject to any disclaimer, the term of this patent is extended or adjusted under 35 U.S.C. 154(b) by 777 days.

(21) Appl. No.: 11/716,049

(22) Filed: Mar. 9, 2007

(65) Prior Publication Data

US 2007/0217077 A1 Sep. 20, 2007

(30) Foreign Application Priority Data

Mar. 16, 2006 (JP) ............................. 2006-072388

(51) Int. Cl.
G11B 5/39 (2006.01)
(52) U.S. Cl. ............................... 360/324.12; 360/324.2
(58) Field of Classification Search ............... 360/324.2, 360/324.12, 327.1
See application file for complete search history.

(56) References Cited

U.S. PATENT DOCUMENTS

| | | | |
|---|---|---|---|
| 7,280,325 B1 * | 10/2007 | Pan ........................ | 360/324.12 |
| 7,675,715 B2 * | 3/2010 | Arasawa et al. ............. | 360/319 |
| 2005/0201024 A1 * | 9/2005 | Gill ........................ | 360/324.12 |
| 2005/0286178 A1 * | 12/2005 | Gill et al. .................. | 360/324.2 |
| 2006/0023376 A1 * | 2/2006 | Gill ........................ | 360/324.12 |
| 2006/0039092 A1 * | 2/2006 | Gill ........................ | 360/324.2 |

FOREIGN PATENT DOCUMENTS

| | | |
|---|---|---|
| JP | 05-275769 | 10/1993 |
| JP | 2002-170211 | 6/2002 |
| JP | 2002-204003 | 7/2002 |
| JP | 2002-232036 | 8/2002 |
| JP | 2002-299726 | 10/2002 |
| JP | 2002-304710 | 10/2002 |
| JP | 2004-348820 | 12/2004 |

* cited by examiner

Primary Examiner—Julie Anne Watko
(74) Attorney, Agent, or Firm—Frommer Lawrence & Haug LLP

(57) ABSTRACT

Provided is a magnetoresistive effect element in which a magneto-sensitive portion is formed in a position where the portion sufficiently receives bias field and the influence of reattachments on reading output is avoided. The magneto-sensitive portion has a pinned layer, a non-magnetic intermediate layer and a free layer. A multilayer, that includes a foundation layer, the magneto-sensitive portion and a cap layer, has upper side surfaces forming an inclination angle $\theta_C$, intermediate side surfaces forming an inclination angle $\theta_S$, and lower side surfaces forming an inclination angle $\theta_U$. The inclination angle $\theta_S$ is greater than both of the inclination angles $\theta_C$ and $\theta_U$. The boundary between the upper side surface and the intermediate side surface is located above a side surface of the magneto-sensitive portion, and the boundary between the intermediate side surface and the lower side surface is located below a side surface of the magneto-sensitive portion.

8 Claims, 10 Drawing Sheets

PRACTICAL EX.

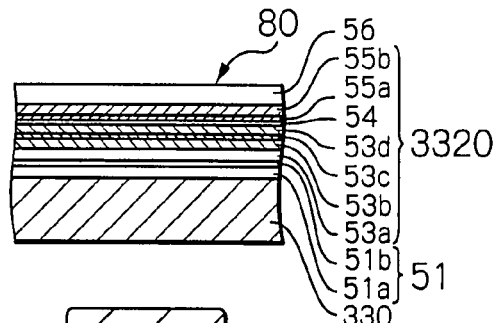
Fig. 8a
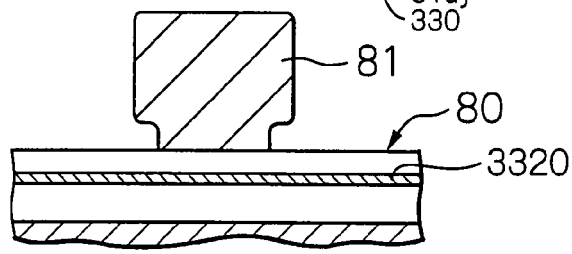
Fig. 8b
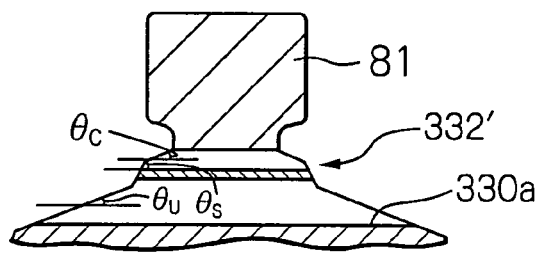
Fig. 8c
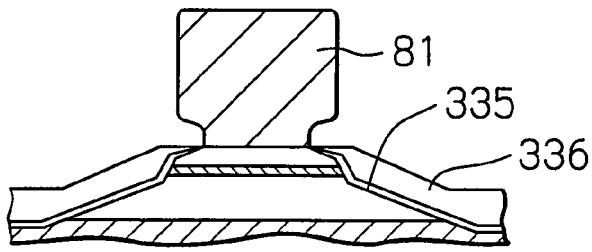
Fig. 8d
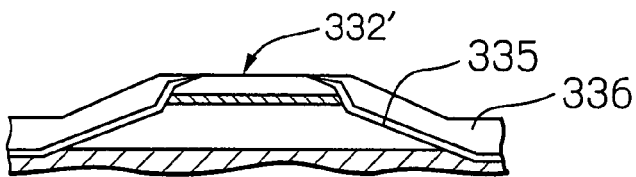
Fig. 8e
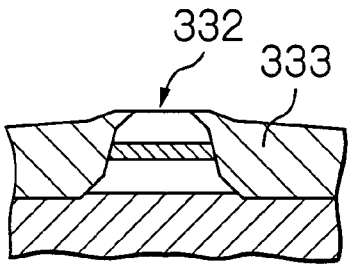
Fig. 8f1
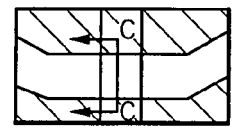
Fig. 8f2

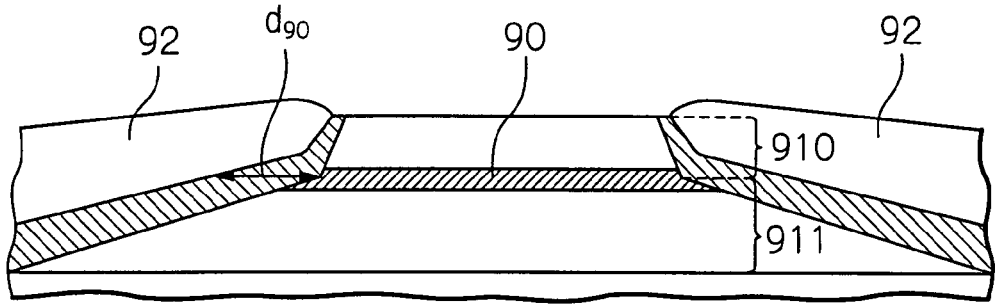
Fig. 9a   COMPARATIVE EX. 1
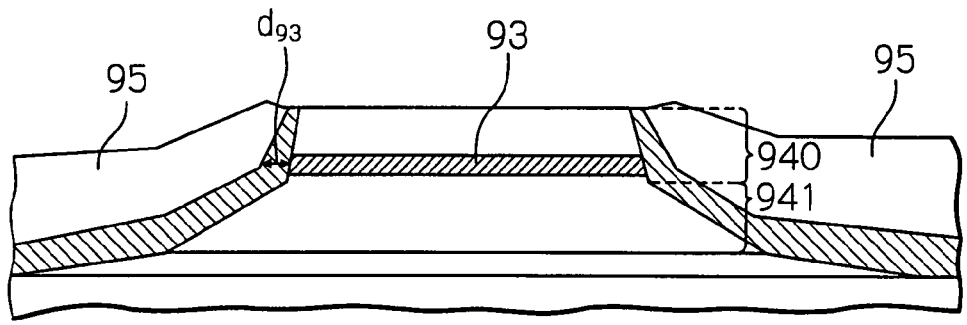
Fig. 9b   COMPARATIVE EX. 2
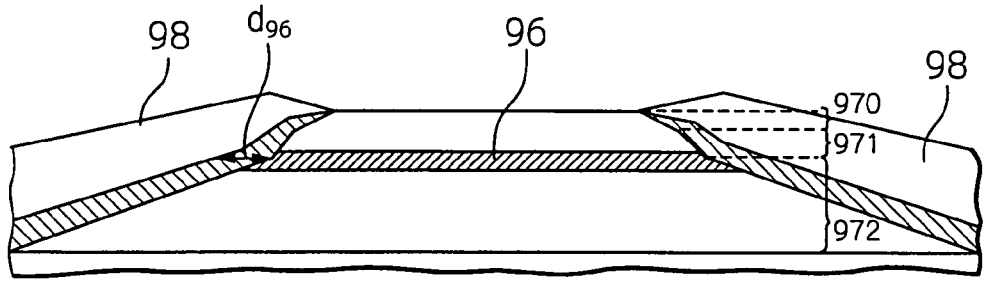
Fig. 9c   COMPARATIVE EX. 3
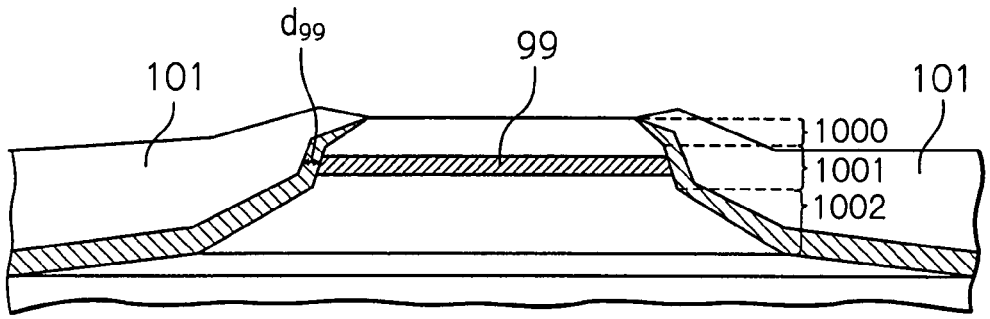
Fig. 9d   PRACTICAL EX.

THIN-FILM MAGNETIC HEAD WITH LITTLE REATTACHMENT

PRIORITY CLAIM

This application claims priority from Japanese patent application No. 2006-72388, filed on Mar. 16, 2006, which is incorporated herein by reference.

BACKGROUND OF THE INVENTION

1. Field of the Invention

The present invention relates to a magnetoresistive (MR) effect element which detects an external magnetic field such as a signal magnetic field and exhibits variations in resistance responsive to the intensity of the magnetic field, a thin-film magnetic head including the MR effect element, a head gimbal assembly (HGA) including the thin-film magnetic head, and a magnetic disk drive apparatus including the HGA. The present invention also relates to a method for manufacturing a thin-film magnetic head including such MR effect element.

2. Description of the Related Art

As magnetic disk drive apparatuses increase in capacity and reduce in size, thin-film magnetic heads having an MR effect element with the giant magnetoresistive (GMR) effect and tunnel magnetoresistive (TMR) effect are being intensively developed in quest to provide highly sensitive and high-output thin-film magnetic heads.

The structures of the MR effect element are broadly classified into two types. One is the current-in-plane (CIP) structure in which sense current flows in parallel with the layer planes of an MR effect multilayer; the other is the current perpendicular-to-plane (CPP) structure in which an MR effect multilayer is sandwiched between upper and lower electrode layers and sense current flows in a direction perpendicular to the layer planes of the multiplayer. The CPP structure is also used in GMR heads as well as TMR heads today as disclosed in Japanese Patent Publication No. 05-275769A, for example. CPP-GMR heads that have a spin valve multiplayer film (including specular-type magnetic multilayer film and dual-spin-valve magnetic multilayer film), like CIP-GMR heads, have also been developed.

The CPP structure uses a magnetic shield layer itself as an electrode and, unlike the CIP structure, does not require an insulating layer between the magnetic shield layer and the MR effect multilayer. Therefore, the CPP structure is more suitable than the CIP structure for narrower read gaps that accommodate ever increasing recording density. Furthermore, the CPP structure is capable of providing higher output from narrow track widths as compared with the CIP structure. Thus, advantageously, the CPP structure has a higher potential to keep pace with increasing recording densities than the CIP structure.

Although the CPP structure is suitable for high recording density, the CPP structure has a problem that reattachments left on the side surface of the MR effect multilayer during formation of the CPP structure acts as parallel paths through which sense current can flow, thereby reducing reading output.

The CPP structure, in which sense current flows between upper and lower electrode layers in a direction perpendicular to the layer planes of the MR effect multilayer, has a magneto-sensitive portion that includes a pinned layer, a non-magnetic intermediate layer, and a free layer, senses a magnetic field and relates to the output. If a reattachment remains on a side surface of the magneto-sensitive portion, a current path parallel with the magneto-sensitive portion is formed, and a sense current diverts through the parallel path, even in the case of the same resistance change by a signal magnetic field, which reduces the output.

FIGS. 10a and 10b show cross-sectional views of an MR effect multilayer for illustrating how such a reattachment is formed. A cross-section of an MR effect multilayer 1100 after patterning using ion milling typically has regions 1105 and 1106 as shown in FIG. 10a. A reattachment on a steeply sloping side surface of the region 1105 is harder to remove during etching using such a method as ion milling than on the side surface of the region 1106. One reason for this is that the reattachment 1104 deposited on a resist 1101 formed on the MR effect multiplayer 1100 as a mask blocks part of ion beam that would reach the side surface of the region 1105 to inhibit the reattachment on the region 1105 from being etched.

To avoid the influence of reattachments, the magneto-sensitive portion may be provided in a position 1103 in the region 1106 where reattachments can be easily removed. However, if the magneto-sensitive portion is provided in the position 1103, the width of the magneto-sensitive portion along the track-width direction is widened as compared with the case where it is provided in a position 1102 in the region 1105, making it difficult to accommodate high recording density. Furthermore, as shown in FIG. 10b, the distance $d_{1103}$ between the free layer in the magneto-sensitive portion and a bias layer such as a hard bias layer provided on both sides of the magneto-sensitive portion is increased as compared with the distance $d_{1102}$, which is disadvantageous in terms of the stability of the magnetic domain in the free layer.

BRIEF SUMMARY OF THE INVENTION

Therefore, an object of the present invention is to provide a manufacturing method of a thin-film magnetic head in which a magneto-sensitive portion is formed in a position where the width along the track-width direction is sufficiently small and a bias field from a bias means can be sufficiently received, and the influence of reattachments on reading output is avoided.

Another object of the present invention is to provide a thin-film magnetic head which has a magneto-sensitive portion in a position where the width along the track-width direction is sufficiently small and a bias field from a bias means can be sufficiently received, and in which left-over of reattachment on a side surface of the magneto-sensitive portion is inhibited, and an HGA including such thin-film magnetic head, and a magnetic disk drive apparatus including such HGA.

Before describing the present invention, terms used herein will be defined. In a multilayer structure of a magnetic head element formed on the element formation surface of a substrate, a component located closer to the substrate than a layer is referred to as being located "lower" or "below" that layer and a component that is located in the stacking direction side of a layer is referred to as being located "upper" or "above" that layer. For example, "a lower electrode layer is located on an insulating layer" means that the lower electrode layer is located in the stacking direction side of the insulating layer.

The side at the rear of a component (the far side) viewed from the air bearing surface (ABS) of the substrate is referred to as the "back side" or "rear" and the side in front of the component is referred to as "front side" or "forward". The surface of periphery of a layer or multilayer between the "upper" surface and the "lower" surface is referred to as a "side surface". "The side surface along the track-width direction" refers to each of the opposite sides in the track-width direction.

According to the present invention, a manufacturing method of a thin-film magnetic head is provided, which comprises steps of:

forming a MR multilayer film comprising a foundation layer, a magneto-sensitive portion and a cap layer by forming: the foundation layer on a lower electrode layer formed on an element formation surface of a substrate; the magneto-sensitive portion including a pinned layer, a free layer, and a non-magnetic intermediate layer sandwiched between the pinned layer and the free layer on the foundation layer; and the cap layer of a material having an ion beam etching rate lower than that of a material of the free layer on the magneto-sensitive portion;

forming a resist pattern on the MR multilayer film; and forming a MR effect multilayer by applying ion beam etching to the MR effect multilayer film by using the resist pattern as a mask in such a manner that an end point of the ion beam etching is below an upper surface of the lower electrode layer.

In the MR effect multilayer formed by the manufacturing method according to the present invention, the inclination angle $\theta_S$ which the side surface of the magneto-sensitive portion forms with the element formation surface is greater than both of the inclination angle $\theta_C$ which the side surface of the upper portion of the cap layer forms with the element formation surface and the inclination angle $\theta_U$ which the side surface of the lower portion of the foundation layer forms with the element formation surface. Because of this profile, the width of the magneto-sensitive portion along the track-width direction becomes sufficiently small, and a more sufficient bias magnetic field, which is generated from a bias layer formed later, can be applied to the free layer. Moreover, little reattachment is left on the side surface of the magneto-sensitive portion after etching. Therefore, a magneto-sensitive portion can be formed in a position where the width along the track-width direction is sufficiently small and a bias field from a bias means can be sufficiently received, and further, the influence of reattachments on reading output is avoided. Consequently, a stable and sufficiently high read output can be realized under higher recording density.

In the manufacturing method according to the present invention, it is preferable that the free layer is formed by depositing a CoFe alloy film, a NiFe alloy film, or a multilayer film consisting of a CoFe alloy film and a NiFe alloy film, and that the cap layer is formed by depositing a Ta film.

Further, in the manufacturing method according to the present invention, it is also preferable that the MR effect multilayer film is irradiated with ion beam at an incidence angle to the element formation surface in a range between 0 and 20 degrees during the ion beam etching.

According to the present invention, a MR effect element is further provided, which comprises:

a substrate having an element formation surface;

a lower electrode layer formed on the element formation surface;

a foundation layer formed on the lower electrode layer;

a magneto-sensitive portion formed on the foundation layer, having a pinned layer, a free layer, and a non-magnetic intermediate layer sandwiched between the pinned layer and the free layer;

a cap layer formed on the magneto-sensitive portion, an upper electrode layer formed on the cap layer; and a bias layer formed on both side surfaces of the magneto-sensitive portion along the track-width direction with an insulating layer being provided between each of the side surface and the bias layer, a inclination angle $\theta_S$ formed by a side surface of the magneto-sensitive portion along the track-width direction to the element formation surface, being greater than both of a inclination angle $\theta_C$ formed by a side surface of an upper portion of the cap layer along the track-width direction to the element formation surface and a inclination angle $\theta_U$ formed by a side surface of a lower portion of the foundation layer along the track-width direction to the element formation surface.

In the MR effect element with above-described side surfaces, the distance between the free layer in the magneto-sensitive portion and the bias layer on both sides of the magneto-sensitive portion becomes smaller than both of the distance between the cap layer and the bias layer and the distance between the foundation layer and the bias layer. Therefore, a more sufficient bias magnetic field is applied to the free layer, and therefore the magnetic domain of the free layer is more stabilized. Furthermore, the width of the magneto-sensitive portion along the track-width direction becomes smaller, and consequently, the structure can accommodate higher recording density. Moreover, little reattachment is left on the side surface of the magneto-sensitive portion after etching by reason about the formation of the multilayer. Consequently, the formation of a current path parallel with the magneto-sensitive portion is avoided and an sufficient output according to a resistance change caused by a signal magnetic filed is ensured.

According to the present invention, a MR effect element is further provided, which comprises:

a substrate having an element formation surface;

a lower electrode layer formed on the element formation surface;

a foundation layer formed on the lower electrode layer;

a magneto-sensitive portion formed on the foundation layer, having a pinned layer, a free layer, and a non-magnetic intermediate layer sandwiched between the pinned layer and the free layer;

a cap layer formed on the magneto-sensitive portion;

an upper magnetic pole layer formed on the cap layer; and a bias layer formed on both side surfaces of the magneto-sensitive portion along the track-width direction with an insulating layer being provided between each of the side surface and the bias layer, a multilayer which includes the foundation layer, the magneto-sensitive portion and the cap layer, having an upper side surface along the track-width direction forming an inclination angle $\theta_C$ to the element formation surface; an intermediate side surface along the track-width direction forming an inclination angle $\theta_S$ to the element formation surface; and a lower side surface along the track-width direction forming an inclination angle $\theta_U$ to the element formation surface, the inclination angle $\theta_C$ being greater than both of the inclination angles $\theta_S$ and $\theta_U$, a boundary between the upper side surface and the intermediate side surface being located above a side surface of the non-magnetic intermediate layer along the track-width direction, and a boundary between the intermediate side surface and the lower side surface being located below a side surface of the non-magnetic intermediate layer along the track-width direction.

In the MR effect element with above-described side surfaces, the distance between the free layer in the magneto-sensitive portion and the bias layer on both sides of the magneto-sensitive portion becomes smaller than both of the distance between the cap layer and the bias layer and the distance between the foundation layer and the bias layer.

Therefore, a more sufficient bias magnetic field is applied to the free layer, and therefore the magnetic domain of the free layer is more stabilized. Furthermore, the width of the magneto-sensitive portion along the track-width direction becomes smaller, and consequently, the structure can accommodate higher recording density. Moreover, little reattachment is left on the intermediate side surface after etching by reason about the formation of the multilayer. The boundary between the upper side surface and the intermediate side surface and the boundary between the intermediate side surface and the lower side surface are located away from the side surface of the non-magnetic intermediate layer. Consequently, the formation of a current path between the cap layer and non-magnetic intermediate layer overleaping the free layer, and the formation of a current path between non-magnetic intermediate layer and the foundation layer overleaping the pinned layer are avoided. Consequently, a sufficient output according to a resistance change caused by a signal magnetic filed is ensured.

In both of the above-described MR effect elements according to the present invention, it is preferable that the cap layer is made of a material having an ion beam etching rate lower than that of a material of the free layer.

Further, in both of the above-described MR effect elements, it is preferable that the free layer is made of a material selected from a group consisting of a CoFe alloy, a NiFe alloy, and a multilayer film of a CoFe alloy and a NiFe alloy, and that the cap layer is made of a Ta film.

According to the present invention, a thin-film magnetic head is further provided, which comprises at least one MR effect element described above as a means for reading data.

According to the present invention, a HGA is further provided, which comprises the above-described thin-film magnetic head and a support structure for supporting the thin-film magnetic head.

According to the present invention, a magnetic recording and reproducing apparatus is further provided, which comprises at least one HGA described above;

at least one magnetic disk; and a recording/reproducing means for controlling read and write operations of the thin-film magnetic head to the at least one magnetic disk.

Further objects and advantages of the present invention will be apparent from the following description of preferred embodiments of the invention as illustrated in the accompanying drawings.

BRIEF DESCRIPTION OF THE SEVERAL VIEWS OF THE DRAWINGS

FIGS. 8a to 8f2 show cross-sectional views illustrating one embodiment of a process for forming an MR effect multilayer and a bias layer according to the present invention;

FIGS. 9a to 9d show cross-sections parallel with the ABS of main parts of the comparative examples 1-3 and the practical example.

DETAILED DESCRIPTION OF THE INVENTION

Figure 1:
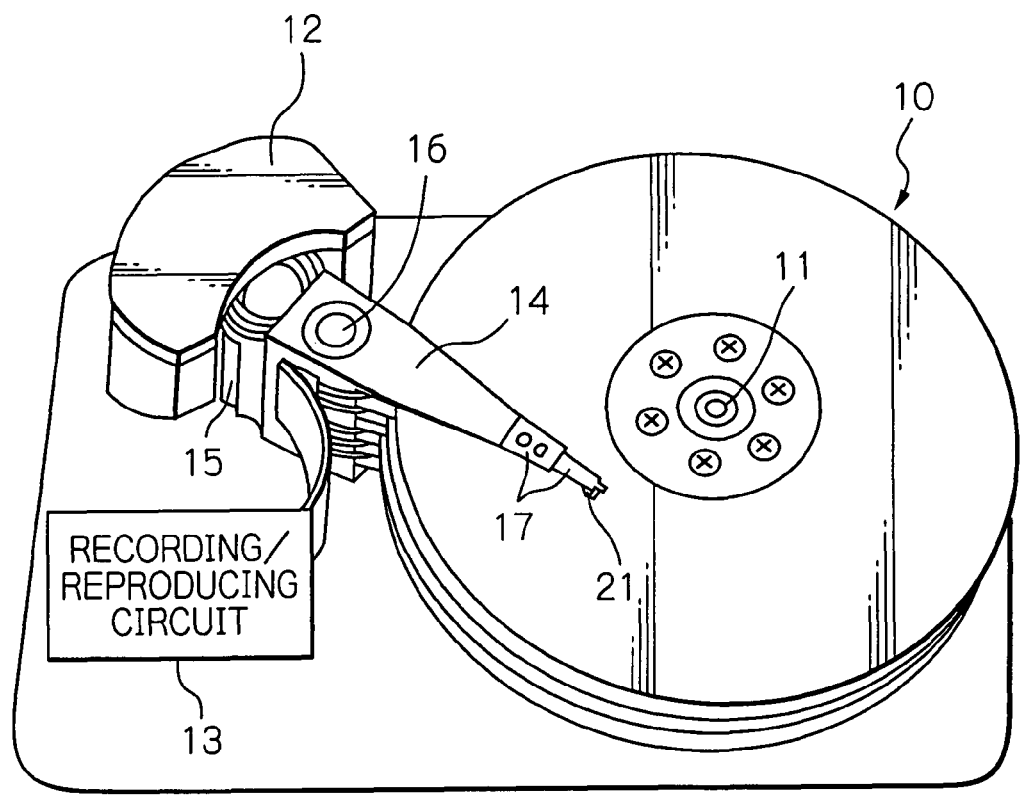
FIG. 1 shows a perspective view schematically illustrating a configuration of a main part of one embodiment of a magnetic disk apparatus according to the present invention.

FIG. 1 shows a perspective view schematically illustrating a configuration of a main part of one embodiment of a magnetic disk apparatus according to the present invention.

In FIG. 1, reference numeral 10 denotes multiple magnetic disks which rotate about a spindle of a spindle motor 11, 12 denotes an assembly carriage device for positioning a thin-film magnetic head (slider) 21 above a track, and 13 denotes a recording/reproducing circuit for controlling read/write operations of the thin-film magnetic head.

Provided in the assembly carriage device 12 are multiple drive arms 14. The drive arms 14 are capable of angular-pivoting about a pivot bearing axis 16 driven by a voice coil motor 15 and are stacked along the axis 16. An HGA 17 is attached at the end of each drive arm 14. Provided on each HGA 17 is a thin-film magnetic head (slider) 21 in such a manner that it faces the surface of each magnetic disk 10. The numbers of magnetic disks 10, drive arms 14, HGAs 17, and sliders 21 may be one.

While not shown, the recording/reproducing circuit 13 includes a recording/reproducing control LSI, a write gate which receives data to be recorded from the recording/reproducing control LSI, an write circuit which outputs a signal from the write gate to an electromagnetic coil element for writing, which will be described later, a constant current circuit which supplies a sense current to an MR effect element for reading, which will be described later, an amplifier which amplifies output voltage of an MR effect element and a demodulator circuit which outputs reproduced data to the recording/reproducing LSI.

Figure 2:
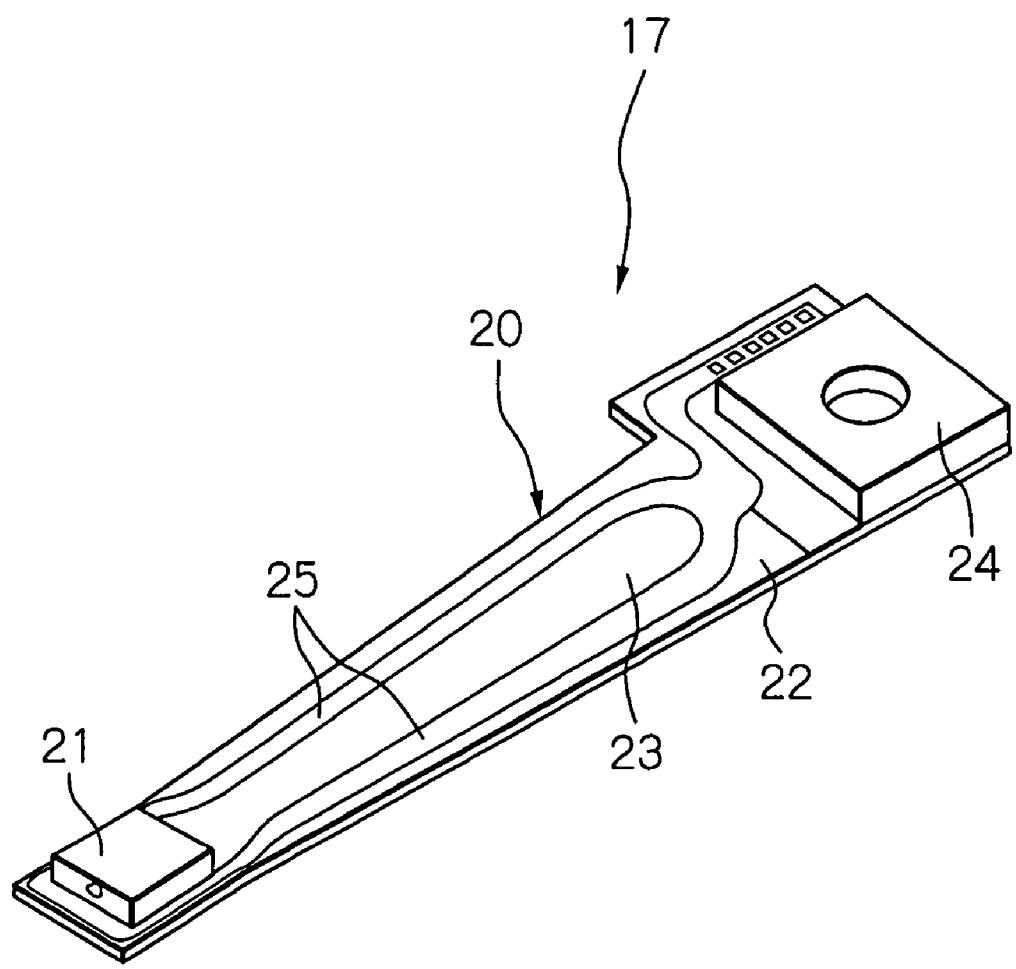
FIG. 2 shows a perspective view of one embodiment of an HGA according to the present invention.

FIG. 2 shows a perspective view of one embodiment of an HGA according to the present invention.

As shown in FIG. 2, the HGA 17 includes the slider 21 that has a magnetic head element and is fixed at the end of a suspension 20. Connected to a terminal electrode of the slider 21 is one end of a wiring member 25.

The suspension 20 includes a load beam 22, an elastic flexure 23 fixed on and supported by the load beam 22, a base plate 24 provided on the base of the load beam 22, and a wiring member 25 which is provided on the flexure 23 and consists of lead conductors and connection pads electrically connected to the ends of the lead conductors. While not shown, a head drive IC chip may be attached at some mid-points of the suspension 20.

Figure 3:
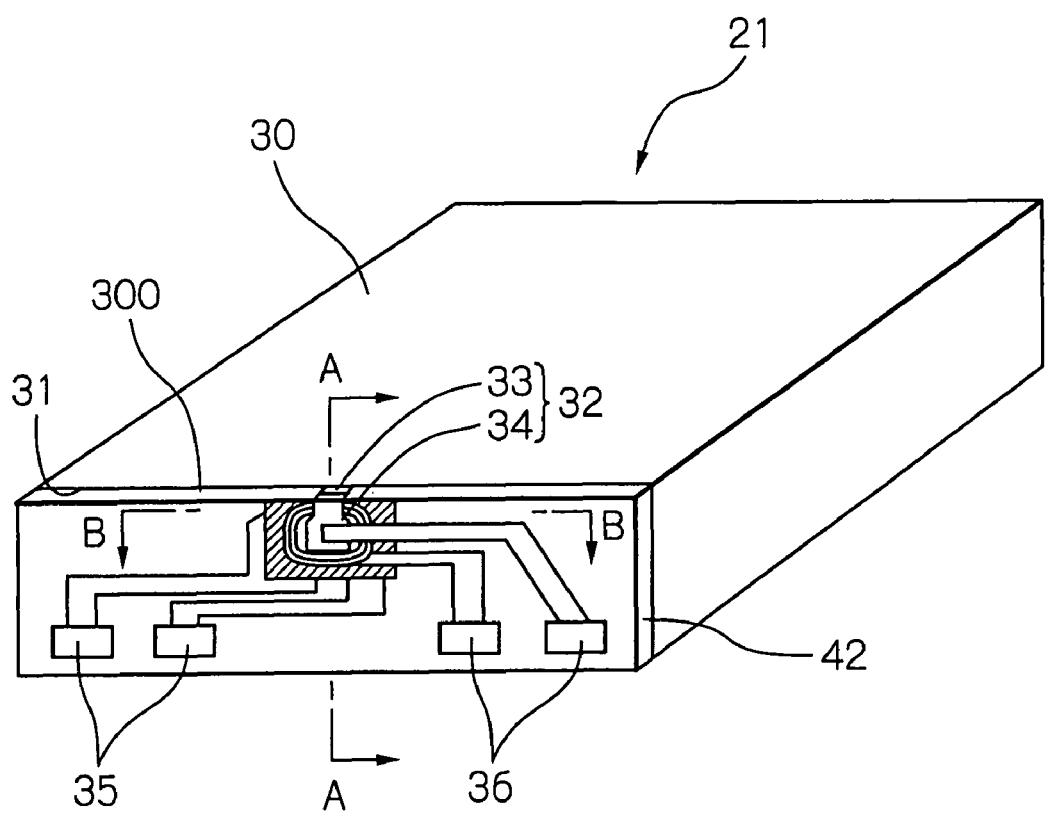
FIG. 3 shows a perspective view of one embodiment of a thin-film magnetic head attached to one end of the HGA shown in FIG. 2 according to the present invention.

FIG. 3 shows a perspective view of one embodiment of a thin-film magnetic head attached to one end of the HGA shown in FIG. 2 according to the present invention.

As shown in FIG. 3, the thin-film magnetic head (slider) 21 according to the present embodiment includes a slider substrate having an ABS 30 processed so as to provide an appropriate flying height and an element formation surface 31, a magnetic head element 32 formed on the element formation surface 31, and pairs of signal electrodes 35 and 36 exposed in the surface of an overcoat layer 42 formed on the element formation surface 31. The magnetic head element 32 includes an MR effect element 33 for reading and an electromagnetic coil element 34 for writing. The signal electrodes 35 and 36 are connected to the MR effect element 33 and the electromagnetic coil element 34, respectively.

One end of each of the MR effect element 33 and the electromagnetic coil element 34 reaches the head end surface 300 on the ABS 30 side. These ends face a magnetic disk, and sense a signal magnetic field from the disk to read data and apply a signal magnetic field to the disk to write data.

Figure 4:
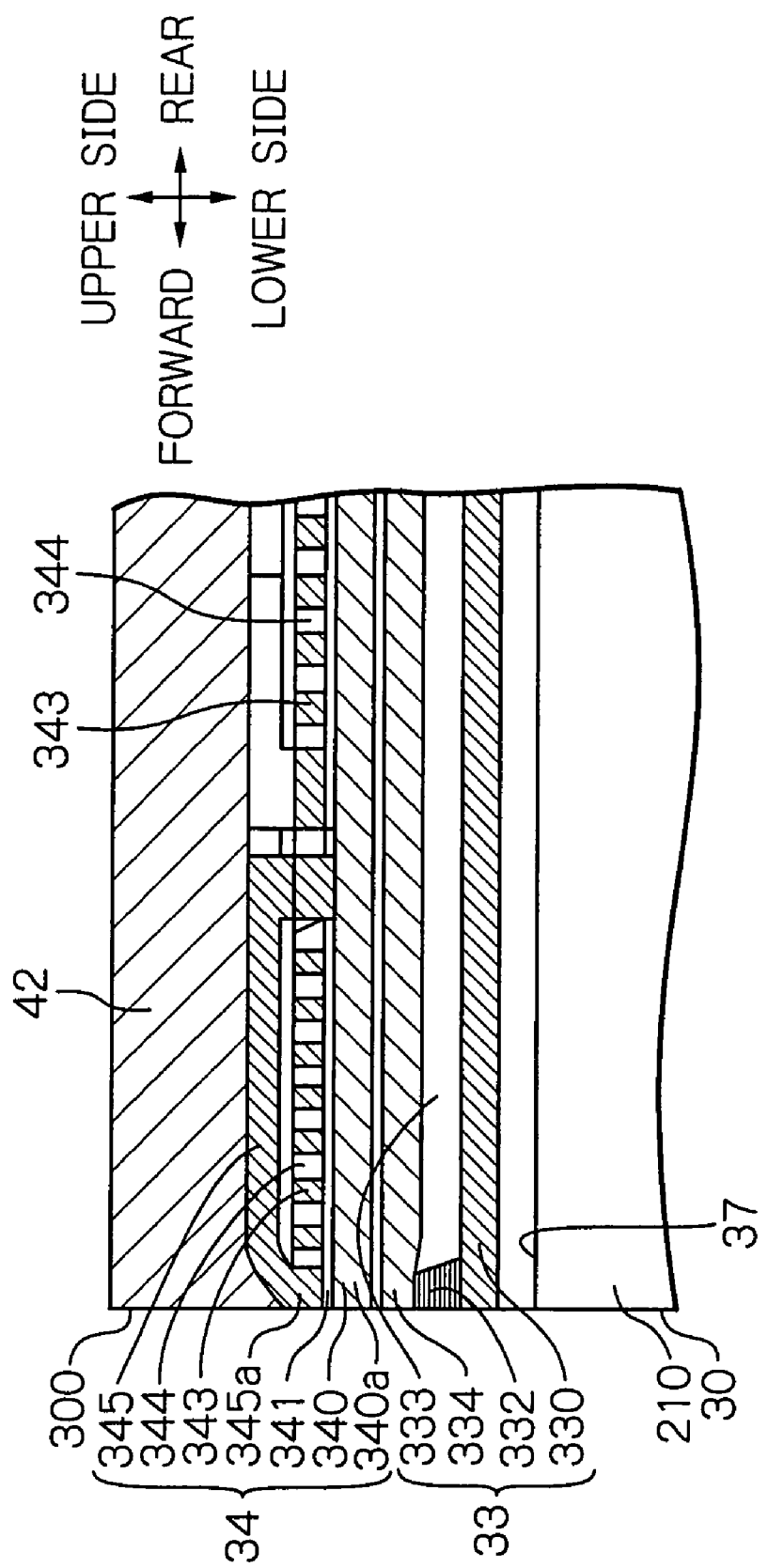
FIG. 4 shows a cross-sectional view taken along line A-A in FIG. 3, illustrating a structure of a main portion of one embodiment of a thin-film magnetic head according to the present invention.

FIG. 4 shows a cross-sectional view taken along line A-A in FIG. 3, illustrating a structure of a main portion of one embodiment of a thin-film magnetic head according to the present invention.

In FIG. 4, reference numeral 210 denotes a slider substrate, which has an ABS 30 facing the surface of a magnetic disk. An MR effect element 33, an electromagnetic coil element 34, and an overcoat layer 42 that protects these elements are formed on an element formation surface 31, which is a side surface when the ABS 30 of the slide substrate 210 is at the bottom.

The MR effect element 33 includes an MR effect multilayer 332, an insulating layer 333 formed on a side surface at the rear of the multilayer, a bias layer 336 (not shown) formed on both side surfaces in the track-width direction of the multilayer with an insulating layer 335 (not shown) between them, and a lower electrode layer 330 and an upper electrode layer 334 placed across the MR effect multilayer 332 and the insulating layer 333 from each other. The MR effect multilayer 332 includes a CPP-GMR effect multilayer film or a TMR effect multilayer film and senses a signal magnetic field from a magnetic disk with an extremely high sensitivity. The upper and lower electrode layers 334 and 330 are electrodes for applying a sense current to the MR effect multilayer 332 in a direction perpendicular to the layer planes of the multiplayer and also acts as a magnetic shield for preventing the multilayer from receiving an external magnetic field which causes noise. The configuration of the MR effect multilayer 332 will be detailed later.

The electromagnetic coil element 34 includes a lower magnetic pole layer 340, a write gap layer 341, a coil layer 343, a coil insulating layer 344, and an upper magnetic pole layer 345. The lower magnetic pole layer 340 and the upper magnetic pole layer 345 function as a magnetic flux guide for a magnetic flux excited by the coil layer 343 and ends 340a and 345a support the end of the write gap layer 341 on the head end surface 300 side by sandwiching the end. A leakage magnetic field from the end of the write gap layer 341 writes data on a magnetic disk for longitudinal recording. The ends of the lower magnetic pole layer 340 and the upper magnetic pole layer 345 that face the magnetic disk reach the head end surface 300, which is coated with a very thin protective coating film such as diamond-like carbon (DLC) coating. While the coil layer 343 in FIG. 4 is a single layer, it may consist of two or more layers or may be a helical coil.

Provided between the upper electrode layer 334 and the lower magnetic pole layer 340 is a non-magnetic layer of an insulating material or a metal material for isolating the MR effect element 33 and the electromagnetic coil element 34. However, this layer is not necessarily needed. The layer may be omitted and the upper electrode layer may be used as the lower magnetic pole layer as well.

Figure 5:
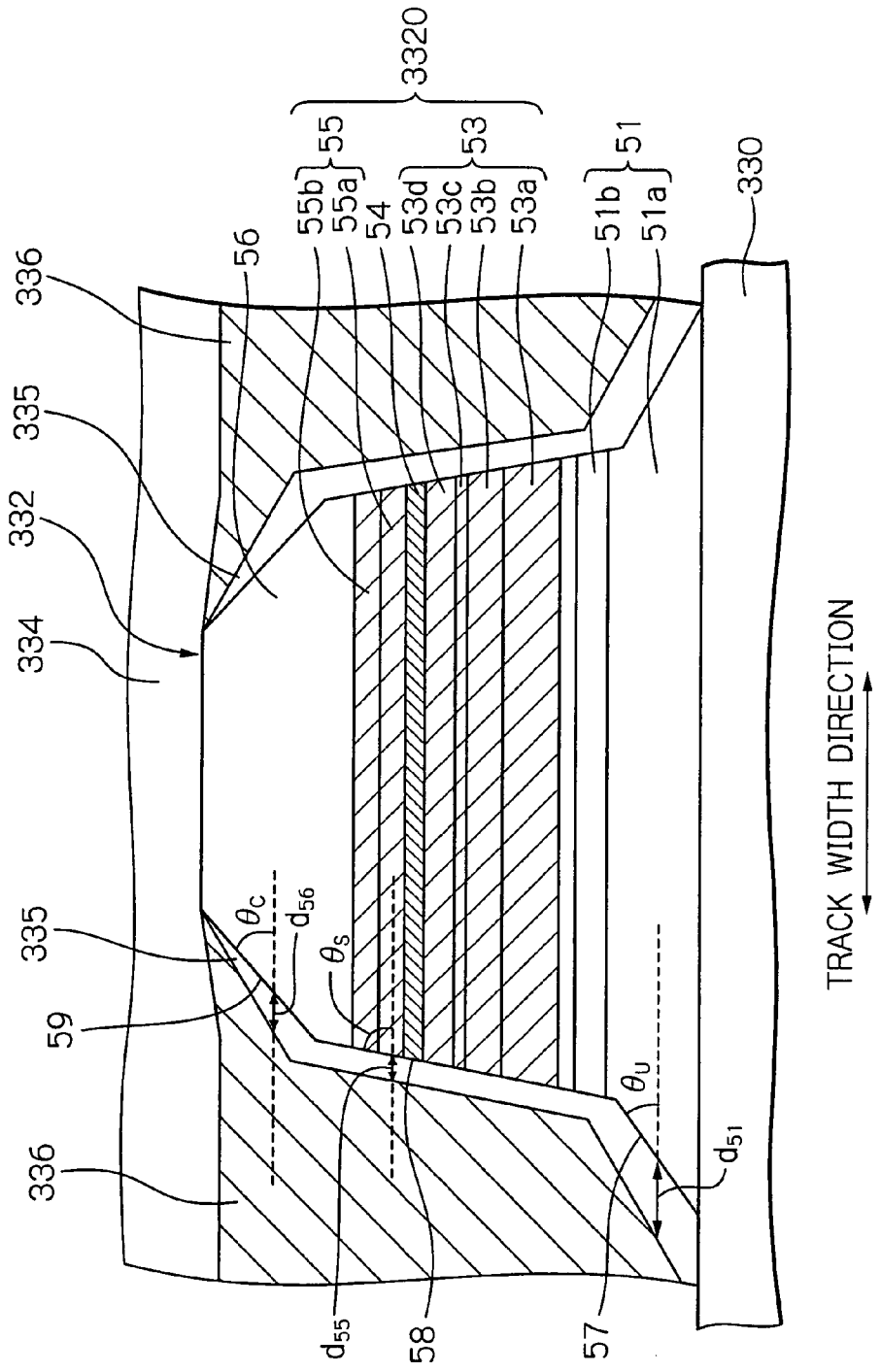
FIG. 5 shows a B-B cross-sectional view viewed from the head end surface in FIG. 3, schematically illustrating a layer structure of one embodiment of an MR effect multilayer.

FIG. 5 shows a B-B cross-sectional view viewed from the head end surface 300 in FIG. 3, schematically illustrating a layer structure of one embodiment of an MR effect multilayer 332.

The MR effect multilayer 332 shown includes a TMR effect multilayer film. The MR effect multilayer 332 may include a CPP-GMR effect multilayer film as mentioned above. Reference numeral 51 denotes a foundation layer, 53 denotes a pinned layer including an antiferromagnetic film, 54 denotes a tunnel barrier layer, which is a non-magnetic intermediate layer, 55 denotes a free layer, and 56 denotes a cap layer. The pinned layer 53, the tunnel barrier layer 54, and the free layer 55 constitute a magneto-sensitive portion 3320 that senses a magnetic field and relates to output.

The foundation layer 51 consists of first and second foundation films 51a and 51b formed on the lower electrode layer 330 and electrically connects the TMR effect multilayer 332 itself to the lower electrode layer 330. The cap layer 56 electrically connects the TMR effect multilayer 332 itself to the upper electrode layer 334 formed on the cap layer 56. Accordingly, a sense current in detecting a magnetic field flows in a direction perpendicular to the layer planes of the TMR effect multilayer between upper and lower electrode layers. The foundation layer 51 may be formed by a single foundation film.

Provided on both sides of the magneto-sensitive portion 3320 along the track-width direction is a bias layer 336 of a hard magnetic material with a thin insulating layer 335 between them. The bias layer 336 applies a bias magnetic field to the free layer 55 to improve stabilization of the magnetic domain of the free layer 55.

The antiferromagnetic film 53a is formed on the foundation layer 51. stacked on the antiferromagnetic film 53a are a first ferromagnetic film 53b, a non-magnetic layer 53c, and a second ferromagnetic film 53d, in this order, to form the so-called synthetic ferri structure. An exchange bias magnetic field is applied to the first ferromagnetic film 53b through exchange coupling with the antiferromagnetic film 53a, thereby stably pinning the magnetization of the entire pinned layer 53.

The free layer 55, formed on the tunnel barrier layer 54, consists of a high-polarizability film 55a and a soft magnetic film 55b, stacked in this order from the tunnel barrier layer 54 side. The free layer 55, which changes in magnetization direction in response to an applied signal magnetic field, forms a ferromagnetic tunnel coupling with the pinned layer 53 by using the tunnel barrier layer as the barrier for tunnel effect. Accordingly, when the direction of magnetization of the free layer 55 changes in response to a signal magnetic field, the state densities of up- and down-spin bands of the free layer 55 change, which then increase or decrease tunnel current. As a result, the electric resistance of the MR effect multilayer 332 changes. By measuring the amount of the change, a faint, local signal magnetic field can be reliably detected with high sensitivity. The high-polarizability film 55a is not necessarily needed and can be omitted. If it is omitted, a resistance change equivalent to the soft magnetic film 55b that would then exist at the interface with the tunnel barrier layer 54 is implemented.

The inclination angle $\theta_S$ which the side surface 58 of the magneto-sensitive portion 3320 forms with the element formation surface is greater than both of the inclination angle $\theta_C$ which the side surface 59 of the upper portion of the cap layer 56 forms with the element formation surface and the inclination angle $\theta_U$ which the side surface of the lower portion of the foundation layer 51 forms with the element formation surface (i.e. $\theta_S > \theta_C, \theta_U$). Because of this profile, the distance $d_{55}$ between the free layer 55 in the magneto-sensitive portion 3320 and the bias layer 336 on both sides of the magneto-sensitive portion 3320 is smaller than both of the distance $d_{56}$ between the cap layer 56 and the bias layer 336 and the distance $d_{51}$ between the foundation layer 51 and the bias layer 336. Therefore, a more sufficient bias magnetic field is applied to the free layer 55, and therefore the magnetic domain of the free layer 55 is stabilized as compared with a structure in which the magneto-sensitive portion 3320 is positioned in such a manner that its ends are located at the side surfaces 57 and 59. Furthermore, when the magneto-sensitive portion 3320 has an end at the side surface 58, the width of the magneto-sensitive portion 3320 along the track-width direction is small as compared when the magneto-sensitive portion 3320 has an end at the side surface 57. Consequently, the structure can accommodate higher recording density.

Moreover, when the MR effect multilayer 332 has such a profile, little reattachment is left on the side surface 58 of the magneto-sensitive portion 3320 after etching by reason about the formation of the multilayer. Consequently, the formation of a current path parallel with the magneto-sensitive portion 3320 is avoided and an sufficient output according to a resistance change caused by a signal magnetic filed is ensured.

Figure 6:
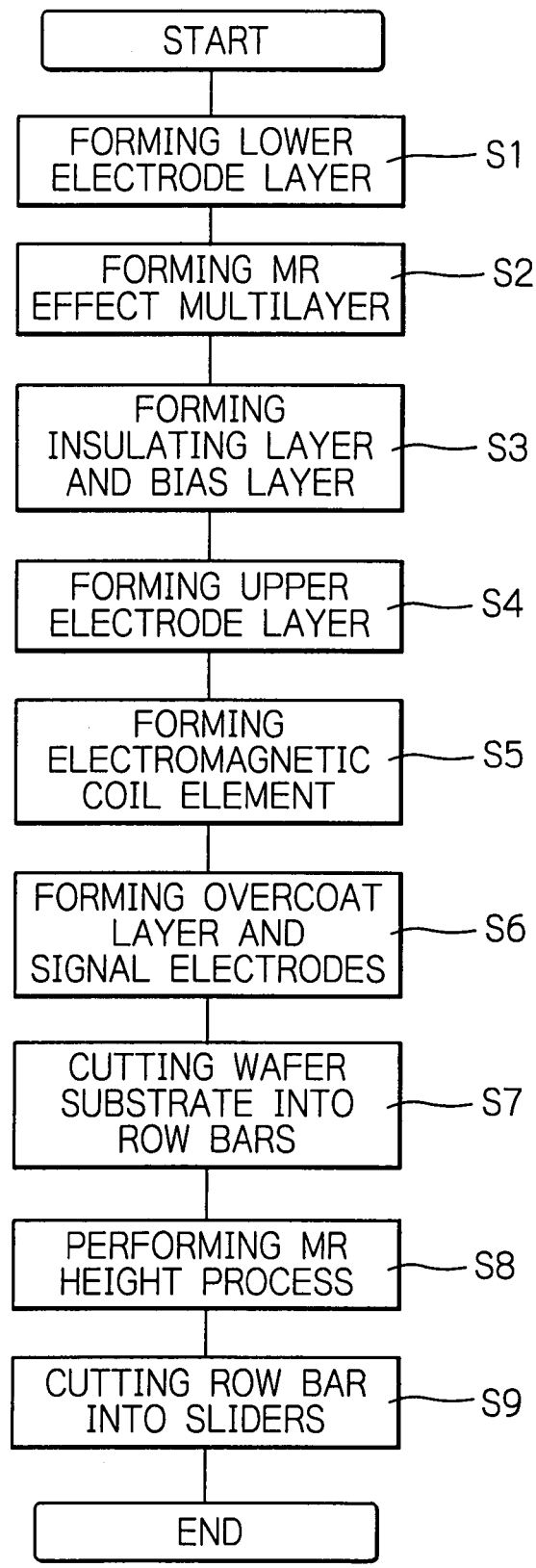
FIG. 6 shows a flowchart showing an outline of one embodiment of a manufacturing method of a thin-film magnetic head according to the present invention.

FIG. 6 shows a flowchart showing an outline of one embodiment of a manufacturing method of a thin-film magnetic head according to the present invention.

As shown in the figure, first a lower electrode layer is formed on the element formation surface of a wafer substrate for sliders (step S1), then an MR effect multilayer is formed (step S2), an insulating layer and a bias layer are formed (step S3), and then an upper electrode layer is formed (step S4) to complete an MR effect element. An electromagnetic coil element is then formed (step S5), an overcoat layer and signal electrodes are formed (step S6), to end the wafer substrate process.

The wafer substrate after the formation process is cut into row bars on which multiple magnetic head elements are arranged in line (step S7). Then an MR height process is performed by polishing the row bar to provide a desired MR height (step S8). The thin-film magnetic head manufacturing process ends with cutting up the row bar subjected to the MR height process into individual sliders (thin-film magnetic heads) (step S9).

FIGS. 7a to 7f shows cross-sections taken along line A-A in FIG. 3, illustrating a process for forming the MR effect element and the electromagnetic coil element shown in FIG. 4 according to an embodiment.

Figure 7A:
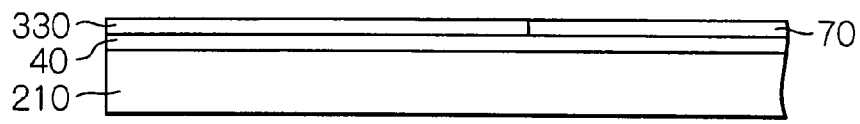
FIGS. 7a to 7f shows cross-sections taken along line A-A in FIG. 3, illustrating a process for forming the MR effect element and the electromagnetic coil element shown in FIG. 4 according to an embodiment.

As shown in FIG. 7a, first a foundation insulating layer 40 of a material such as $Al_2O_3$ (alumina) or $SiO_2$ (silicon dioxide) with a thickness of approximately 0.1-5 μm (micrometer) is formed on a slider substrate (wafer substrate) 210 made of a material such as Altic ($Al_2O_3$—TiC) by using a method such as sputtering. Then a lower electrode layer 330 of NiFe, CoFeNi, CoFe, CoFeN, or FeZrN or a multilayer film of these materials with a thickness of approximately 0.5-3 μm is formed by a method such as frame plating. Then, an insulating film of a material such as $Al_2O_3$ or $SiO_2$ is formed by using a method such as sputtering and is planarized by chemical mechanical polishing (CMP) or the like to form a planarized layer 70.

Figure 7B:
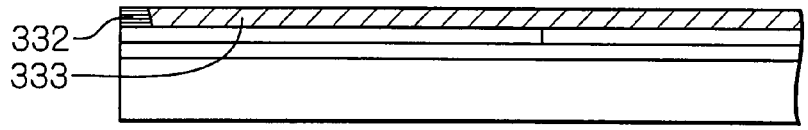

Then, as shown in FIG. 7b, an MR effect multilayer 332 and an insulating layer 333 are formed on a lower shield layer 330. An insulating layer 335 and a bias layer 336, not shown, are then formed. The method for forming these is a feature of the present invention and will be described later in detail.

Figure 7C:
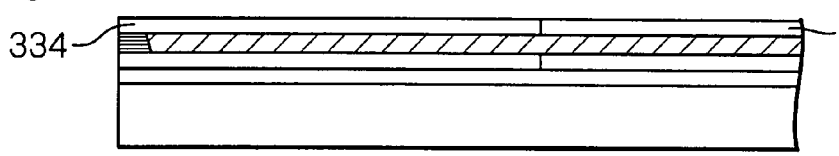

Then, as shown in FIG. 7c, an upper electrode layer 334 of NiFe, CoFeNi, CoFe, FeN or FeZrN, for example or a multilayer film of these with a thickness of approximately 0.5-3 μm is formed by using frame plating. With that, the formation of the MR effect element 33 is completed. Then, an insulating film of a material such as $Al_2O_3$ or $SiO_2$ is formed by using a method such as sputtering and is planarized by using a method such as CMP to form a planarized layer 71.

Figure 7D:
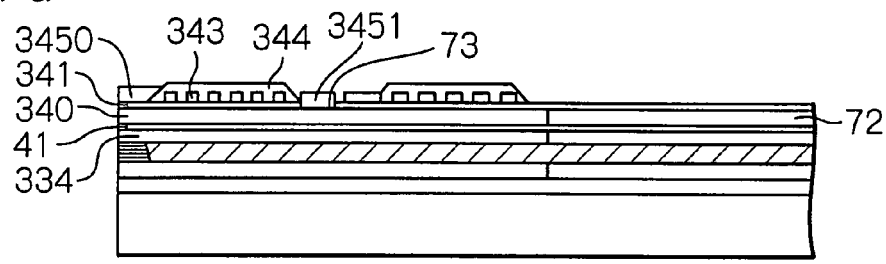

Then, as shown in FIG. 7d, a non-magnetic layer 41 of an insulating material such as $Al_2O_3$, $SiO_2$, AlN or DLC or a metal material such as Ti, Ta or Pt with a thickness of approximately 0.1-0.5 μm is formed to isolate the MR effect element 33 from an electromagnetic coil element which will be formed later. Then, a lower magnetic pole layer 340 of a material such as NiFe, CoFeNi, CoFe, FeN, or FeZrN or a multilayer film of these with a thickness of approximately 0.5-3 μm is formed by using a method such as frame plating. An insulating film of a material such as $Al_2O_3$ or $SiO_2$ is formed by using a method such as sputtering and then is planarized by using a method such as CMP to form a planarized layer 72.

Then, as shown in FIG. 7d, a write gap layer 341 of an insulating material such as $Al_2O_3$, $SiO_2$, AlN or DLC is formed to a thickness approximately 0.01-0.05 μm by using a method such as sputtering or CVD. Then, a portion of the write gap layer 341 is removed by using dry etching such as milling or reactive ion etching (RIE) through a resist mask pattern to expose the lower magnetic pole layer 340 to form a back gap layer 73. Then, a coil layer 343 of a material such as Cu with a thickness of 1-5 μm is formed by using a method such as frame plating.

Then, as shown in FIG. 7d, a coil insulating layer 344 of a resin such as a heat-cured novolac resist with a thickness of approximately 0.5-7 μm is formed by using a method such as photolithography. Then, an upper magnetic pole 3450 and a back contact magnetic pole 3451 of a material such as NiFe, CoFeNi, CoFe, FeN or FeZrn or a multilayer of these materials with a thickness of approximately 0.5-3 μm is formed on the write gap layer 431 by using a method such as frame plating.

Figure 7E:
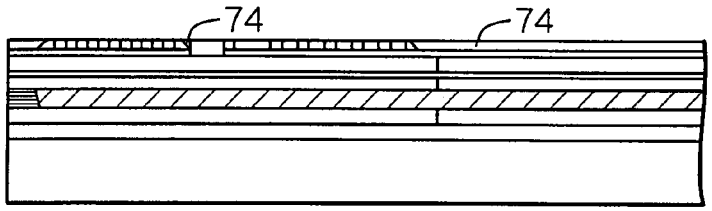
Figure 7F:
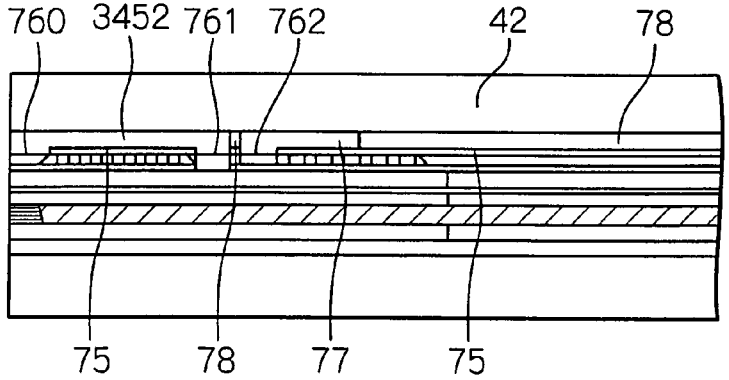
Figure 10A:
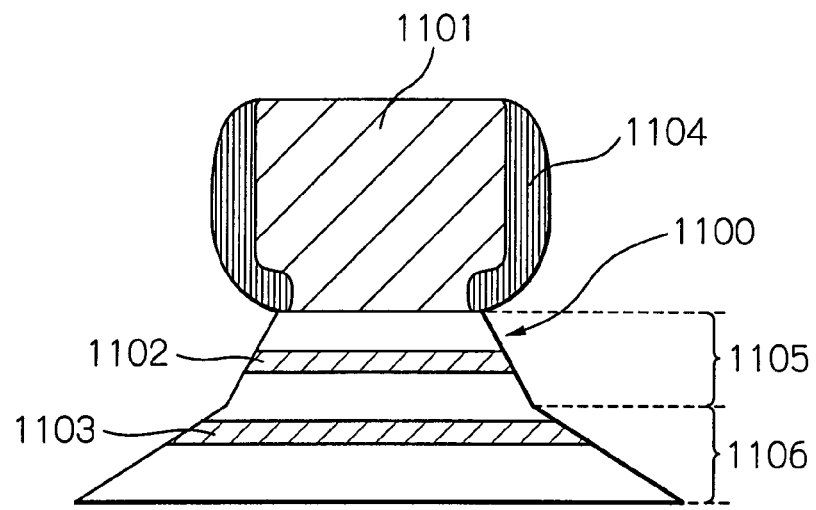
FIGS. 10a and 10b show cross-sectional views of an MR effect multilayer for illustrating how a reattachment is formed.
Figure 10B:
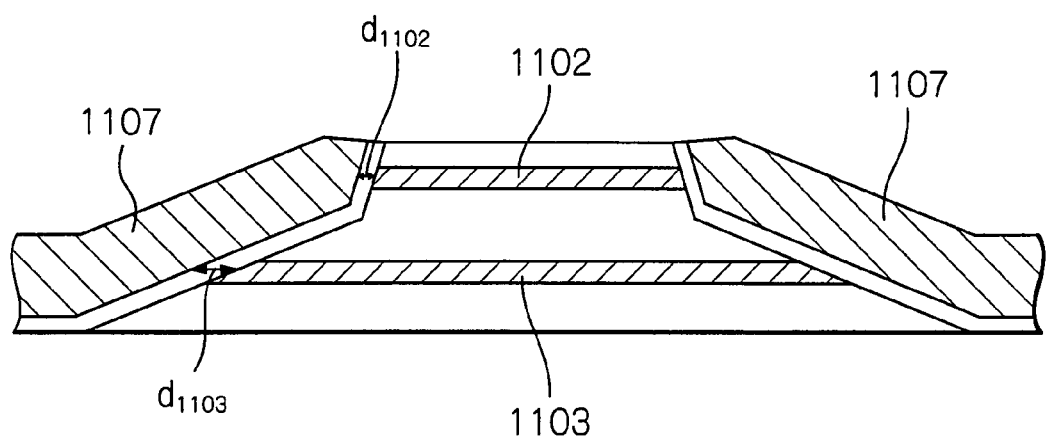

Then as shown in FIG. 7(E), an insulating film of a material such as $Al_2O_3$ or $SiO_2$ is formed by using a method such as sputtering and is then planarized by using a method such as CMP to form a planarized layer 74. As shown in FIG. 7f, an insulating layer 75 of a material such as $Al_2O_3$ or $SiO_2$ is then formed by using a method such as sputtering or CVD. Then the lower layer is exposed by using dry etching such as milling or RIE through a resist mask pattern to form an upper magnetic pole-yoke junction 760, a back contact magnetic pole-yoke junction 761, and a coil lead 762.

Then as shown in FIG. 7f, a yoke layer 3452 and a coil lead layer 77 of a material such as NiFe, CoFeNi, CoFe, FeN or FeZrN or a multilayer film of these materials with a thickness of approximately 0.5-3 μm are formed by using a method such as frame plating. The coil lead layer 77 may be separately formed from a material such as Cu by using a method such as frame plating. Then trimming is applied to unify the widths along the track-width direction of the facing surface of the upper magnetic pole 3450 and the lower magnetic pole layer 340 with the write gap layer 341 between them. With the foregoing process, the upper magnetic pole 3450, the back contact magnetic pole 3451, and the yoke layer 3452 are formed and thus the formation of the upper magnetic pole layer 345 is completed.

Then, an insulating film of a material such as $Al_2O_3$ or $SiO_2$ is formed by using a method such as sputtering and is planarized by using a method such as CMP to form a planarized layer 78. An overcoat layer 42 of a material such as $Al_2O_3$ or $SiO_2$ is formed on the planarized surface by using a method such as sputtering. Thus, the process for forming the MR effect element and electromagnetic coil element is completed.

FIGS. 8a to 8/2 show cross-sectional views illustrating one embodiment of a process for forming an MR effect multilayer and a bias layer according to the present invention.

As shown in FIG. 8a, first formed on a lower electrode layer 330 by using a method such as sputtering are a first foundation film 51a of a material such as Ta, Hf, Nb, Zr, Ti, Mo, or W with a thickness of approximately 1-5 nm, a second foundation film 51b of a material such as Ru with a thickness of approximately 1-2 nm, an antiferromagnetic film 53a of a material such as IrMn, PtMn, NiMn or RuRhMn with a thickness of approximately 5-15 nm, a first ferromagnetic film 53b of a material such as CoFe with a thickness of approximately 2-3 nm, a non-magnetic film 53c of one or more alloys of materials selected from a group consisting of Ru, Rh, Ir, Cr, Re, and Cu with a thickness of approximately 0.8 nm, and a second ferromagnetic film 53d of a material such as CoFe with a thickness of approximately 2-3 nm, in this order.

Then, on the second ferromagnetic layer 53d, a metal film of a material such as Al, AlCu, Mg or Ti with a thickness of approximately 0.5-1 nm is formed by using a method such as sputtering. The metal film is then oxidized with oxygen introduced in the vacuum system or through natural oxidization to form a tunnel barrier layer 54. On the tunnel barrier layer 54, a high-polarizability film 55a of a material such as CoFe with a thickness of approximately 1 nm, a soft magnetic film 55b of a material such as NiFe with a thickness of approximately 3-4 nm, and a cap layer 56 of a material such as Ta, Ru, Hf, Nb, Zr, Ti, Mo, or W are formed in this order by using a method such as sputtering. Thus, an MR effect multilayer film 80 is formed.

Here, a material for the cap layer 56 is chosen which has an ion-beam etching rate lower than that of the material of a free layer 55. For example, if the free layer 55 is made of a CoFe alloy or a NiFe alloy, then for example Ta is used as the material of the cap layer 56. In practice, if the cap layer is made of Ta, the ratio $R_0/R_2$ of the etching rate $R_0$ of the free layer to the etching rate $R_2$ of the cap layer is in the range from 1.2 to 1.4. Experiments have shown that if the ratio is too high, the width of the free layer formed becomes too wide. Preferably, the ratio should be 2.0 or less.

The films of the pinned layer 53, the tunnel barrier layer 54, and the free layer 55 constituting the magneto-sensitive portion 3320 are not limited to the modes described above. Various materials and thicknesses may be used. For example, the pinned layer 53 may have a single-layer structure made of a ferromagnetic film or a multilayer structure consisting of a number of layers, instead of the three-layer structure consisting of three layers in addition to the antiferromagnetic film. Furthermore, the free layer 55 may be a single-layer structure without a high-polarizability film, or a multilayer structure consisting of three or more layers including a magnetostriction control film, instead of the two-layered structure. The pinned layer, the tunnel barrier layer, and the free layer of the magneto-sensitive portion may be formed in the inverse order, that is, in the order of the free layer, the tunnel barrier layer, and the pinned layer. In that case, the antiferromagnetic film in the pinned layer is positioned at the top.

Then, as shown in FIG. 8b, a resist 81 having a resist pattern for lift-off is formed on the MR effect multilayer film 80. After that, an MR effect multilayer 332' is formed by using the resist 81 as a mask and applying ion beam etching with, for example, Ar ions to the MR effect multilayer film 80 in such a manner that the end point of the etching is located below the upper surface 330a of the lower electrode layer 330. Preferably, when the MR effect multilayer film is irradiated with the ion beam, the substrate with the MR effect multilayer film 80 is rotated so that the incidence angle to the element formation surface is in the range from 0 to 20 degrees. Experiments have shown that the ion beam does not need to be applied to the element formation surface exactly perpendicularly (at an incidence angle of 0 degree) to the element formation surface, but the side surfaces having the three inclination angles described above can be formed, under the condition that the incidence angle is between 0 and 20 degrees and the etching rate of the cap layer material becomes smaller than that of the free layer.

In the MR effect multilayer 332' formed as described above, the inclination angle $\theta_S$ which the side surface of the magneto-sensitive portion 3320 forms with the element formation surface, namely the lower electrode layer 330, is greater than both of the inclination angle $\theta_C$ formed by the side surface of the upper part of the cap layer 56 with the lower electrode layer 330 and the inclination angle $\theta_U$ formed by the side surface of the lower part of the foundation layer 51 with the lower electrode layer 330. In the structure having these side surfaces, the magneto-sensitive portion 3320 is sufficiently small in width along the track-width direction and is provided in a position where it can receive a bias magnetic filed applied by a bias layer, which will be formed later. Furthermore, little reattachment during etching remains on the side surfaces of the magneto-sensitive portion 3320. Thus, left-over of reattachments are sufficiently inhibited.

The reason why little reattachment remains in the magneto-sensitive portion 3320 will be described later with respect to a practical example of the present invention and comparative examples.

After the MR effect multilayer 332' is formed as described above, an insulating layer 335 of a material such as $Al_2O_3$ or $SiO_2$ with a thickness of approximately 3-20 nm and a bias layer 336 of a material such as CoFe, NiFe, CoPt, or CoCrPt are formed, in sequence, by using a method such as sputtering as shown in FIG. 8d. The resist 81 is then removed using lift-off as shown in FIG. 8e.

Then, as shown in FIGS. 8/1 and 8/2, the MR effect multilayer 332' is further patterned by using a patterning method such as photolithography to form an MR multilayer 332 and then an insulating film 333 is formed by using a method such as sputtering or ion beam sputtering. It should be noted that FIG. 8/1 is a cross-section taken along line C-C in FIG. 8/2. With the step described above, the process for forming the MR effect multilayer 332 and the bias layer 336 is completed.

A practical example of an MR effect element according to the present invention and comparative examples are given below and effects of the present invention will be described in detail.

Practical Example and Comparative Examples 1-3

Samples of the comparative examples 1-3 of the MR effect element and a practical example of the MR effect element according to the present invention will be described first. In all of the samples, first, an MR effect multilayer was formed on a lower electrode layer. The MR effect multilayer was a TMR effect multilayer formed by performing patterning in the track-width direction by using photolithography and ion milling to a multilayer provided by forming a 5 nm-thick Ta film and 2 nm-thick Ru film which constitute first and second foundation films, a 15 nm-thick PtMn film which constitutes an antiferromagnetic film, a 0.8 nm-thick Ru film and a 3 nm-thick CoFe film which constitute a first ferromagnetic film, a non-magnetic film and a second ferromagnetic film, a 1 nm-thick oxidized AlCu film which constitute a tunnel barrier layer, a 1 nm-thick CoFe film and a 4 nm-thick NiFe film which are high-polarizability film and a soft magnetic film constituting a free layer, and a cap layer, in this order. Then, a 15 nm-thick insulating layer and a bias layer were formed on both sides of the TMR effect multilayer patterned in the track-width direction. Then an insulating layer was formed in the rear of the TMR effect multilayer, and finally upper and lower electrode layers were formed to complete an MR effect element samples.

Table 1 shows configurations of cap layers of samples in the comparative examples 1-3 and the practical example, and also shows the end points of ion milling in pattering in the track-width direction.

TABLE 1

|  | Cap layer | End point of ion milling |
| --- | --- | --- |
| Comparative ex. 1 | 7 nm thick Ru | Upper surface of the first foundation film |
| Comparative ex. 2 | 7 nm thick Ru | Overetching position by 3 nm from upper surface of lower electrode layer |
| Comparative ex. 3 | 5 nm thick Ti | Upper surface of the first foundation film |
| Practical example | 5 nm thick Ti | Overetching position by 3 nm from upper surface of lower electrode layer |

In Table 1, the comparative examples 1 and 2 differ from the comparative example 3 and the practical example in the constituent material and thickness of the cap layer. The ion beam etching rate $R_1$ of Ru which is the constituent material of the cap layer in the comparative examples 1 and 2 is approximately equivalent to the etching rate $R_0$ of the constituent material of the free layer described above. That is, $R_0/R_1$ is approximately 1. On the other hand, the ion beam etching rate $R_2$ of Ta which is the constituent material of the cap layer in the comparative example 3 and the practical example is lower than $R_0$. Actually, $R_0/R_2$ is approximately 1.2 to 1.4. The thickness of the cap layer varies because the total etching time of the samples were made equivalent under taking the difference of ion milling etching rate into consideration.

FIGS. 9a to 9d show cross-sections parallel with the ABS of main parts of the comparative examples 1-3 and the practical example. Table 2 shows measurement results of the difference between the width $W_R$ of the resist in each of these samples along the track-width direction and the width $W_F$ of the free layer ($=W_R-W_F$), the resistance value R, and the resistance change ratio ΔR/R. The cross-sectional views in FIGS. 9a to 9d and ΔW in Table 2 are images observed by using a scanning electron microscope and an actual measurement, respectively. The resistance values R and resistance change ratios ΔR/R in Table 2 are the average of 40 values actually measured in each sample by using a tester.

TABLE 2

|  | ΔW (nm) | R (Ω(ohm)) | ΔR/R (%) |
| --- | --- | --- | --- |
| Comparative ex. 1 | 9.8 | 54.7 | 12.4 |
| Comparative ex. 2 | 11.3 | 53.2 | 9.3 |
| Comparative ex. 3 | 6.4 | 52.8 | 12.1 |
| Practical example | 10.7 | 55.3 | 12.3 |

Referring to FIG. 9a, the sample in the comparative example 1 has two regions 910 and 911 whose side surfaces have different inclination angles. Although the magneto-sensitive portion 90 extends to region 911 that is wider in the track-width direction than region 910, the width of the magneto-sensitive portion 90 in the track-width direction is narrower than the sample of the comparative example 3 which has the same milling end point position. While a reattachment was observed on the side surface of region 910, the magneto-sensitive portion 90 was not affected by the reattachment because the magneto-sensitive portion 90 is in a position extending to region 911. Actually, referring to Table 2, a sufficiently large resistance change ratio ΔR/R was obtained. However, the distance $d_{90}$ between the free layer of the magneto-sensitive portion 90 and the bias layer 92 along the track-width direction is so large that the magnetic domain of the free layer cannot sufficiently be stabilized. Therefore read output becomes unstable.

Referring to FIG. 9b, the sample in the comparative example 2 has two regions 940 and 941 whose side surfaces have different inclination angles. The magneto-sensitive portion 93 is in region 940 and is narrower in the track-width direction as in the practical example having the same milling end point position. However, a reattachment was observed on the side surface of the magneto-sensitive portion 93. Referring to Table 2, both of the resistance value R and the resistance change ratio ΔR/R were smaller than those in the practical example. This means that the reattachment acts as a current path parallel with the magneto-sensitive portion, and therefore an intended output cannot be obtained with the same resistance change.

Referring to FIG. 9c, the sample in the comparative example 3 has three regions 970, 971, and 972 whose side surfaces have different inclination angles. In this sample, the different inclination angles of the three regions worked as described above so that reattachments were not observed on the surface of region 971. As a result, a sufficiently large resistance change ratio ΔR/R was obtained as shown in Table 2. However, since the magneto-sensitive portion 96 extends to region 972, ΔW is small. Consequently, the width along the track-width direction is wide. The increase in width also showed up as a decrease in the resistance value R. This means that the sample is difficult to accommodate high recording densities. Furthermore, the distance $d_{96}$ also increased, which poses a problem in stabilization of the magnetic domain of the free layer.

Referring to FIG. 9d, the sample in the practical example of the present invention has three regions 1000, 1001, and 1002 whose side surfaces are inclined at different angles. In this sample, the different inclination angles of the three regions worked and reattachments were not observed on the side surface of region 1001. Consequently, a sufficiently large resistance change ratio ΔR/R was obtained as shown in Table 2. Furthermore, since the magneto-sensitive portion 99 is positioned in region 1001, ΔW is large. As a result, the width of the magneto-sensitive portion 99 in the track-width direction is sufficiently small. This means that the sample accommodates higher recording densities while at the same time achieves high read output. The distance $d_{99}$ is smaller, which stabilizes the magnetic domain of the free layer. Therefore, magnetically stable output can be achieved.

There is not much difference in ΔW between the samples in the comparative examples 1 and 2 although they differ in end point position of ion milling. This means that the etching rate of the material of the cap layer and that of the free layer were equivalent to each other and therefore the width of the magneto-sensitive portion in the track-width direction approached a predetermined value in a relatively early stage of the etching. Therefore, once the width nearly reached the predetermined value, reattachments that deposited on the resist blocked a considerable part of ion beam. Therefore, the reattachment deposited on the side surface of the magneto-sensitive portion became hard to remove. In contrast, if the etching rate of the material of the cap layer is lower than that of the material of the free layer as in the present invention, the width of the magneto-sensitive portion in the track-width direction is tapered at a given rate. Therefore the ion beam that reached the side surface of the magneto-sensitive portion is unlikely to be blocked. Consequently, a reattachment deposited on the side surface of the magneto-sensitive portion is reliably removed.

Thus, by setting and controlling the etching rate of the material of the cap layer so as to be smaller than that of the material of the free layer to provide an MR effect multilayer having the shape shown in FIG. 9d, a thin-film magnetic head can be implemented, comprising a magneto-sensitive portion which has a sufficiently small width along the track-width direction, and is provided in a position where a bias applied from bias means can be received sufficiently, and whose read output is not affected by reattachments.

All the foregoing embodiments are by way of example of the present invention only and not intended to be limiting, and many widely different alternations and modifications of the present invention may be constructed without departing from the spirit and scope of the present invention. Accordingly, the present invention is limited only as defined in the following claims and equivalents thereto.

The invention claimed is:

1. A magnetoresistive effect element comprising:
   a substrate having an element formation surface;
   a lower electrode layer formed on said element formation surface;
   a foundation layer formed on said lower electrode layer;
   a magneto-sensitive portion formed on said foundation layer, having a pinned layer including an antiferromagnetic film, a free layer, and a non-magnetic intermediate layer sandwiched between said pinned layer and said free layer;
   a cap layer formed on said magneto-sensitive portion and made of a material having an ion beam etching rate lower than that of a material of said free layer;
   an upper electrode layer formed on said cap layer; and
   a bias layer formed on both side surfaces of said magneto-sensitive portion in a track-width direction with an insulating layer being provided between each of said side surface and said bias layer,
   a multilayer which includes said foundation layer, said magneto-sensitive portion and said cap layer, having: upper side surfaces in the track-width direction forming an inclination angle $\theta_C$ to said element formation surface; intermediate side surfaces in the track-width direction forming an inclination angle $\theta_S$ to said element formation surface; and lower side surfaces in the track-width direction forming an inclination angle $\theta_U$ to said element formation surface,
   said inclination angle $\theta_S$ being greater than both of said inclination angles $\theta_C$ and $\theta_U$,
   a boundary between the upper side surface and the intermediate side surface where the inclination angle changes being located above a side surface of said magneto-sensitive portion in the track-width direction, and
   a boundary between the intermediate side surface and the lower side surface where the inclination angle changes being located below a side surface of said magneto-sensitive portion in the track-width direction.

2. The magnetoresistive effect element as claimed in claim 1, wherein said free layer is made of a material selected from a group consisting of a CoFe alloy, a NiFe alloy, and a multilayer film of a CoFe alloy and a NiFe alloy, and wherein said cap layer is made of a Ta film.

3. A thin-film magnetic head comprising at least one magnetoresistive effect element for reading data comprising:
   a substrate having an element formation surface;
   a lower electrode layer formed on said element formation surface;
   a foundation layer formed on said lower electrode layer;
   a magneto-sensitive portion formed on said foundation layer, having a pinned layer including an antiferromagnetic film, a free layer, and a non-magnetic intermediate layer sandwiched between said pinned layer and said free layer;
   a cap layer formed on said magneto-sensitive portion and made of a material having an ion beam etching rate lower than that of a material of said free layer;
   an upper electrode layer formed on said cap layer; and
   a bias layer formed on both side surfaces of said magneto-sensitive portion in a track-width direction with an insulating layer being provided between each of said side surface and said bias layer,
   a multilayer which includes said foundation layer, said magneto-sensitive portion and said cap layer, having: upper side surfaces in the track-width direction forming an inclination angle $\theta_C$ to said element formation surface; intermediate side surfaces in the track-width direction forming an inclination angle $\theta_S$ to said element formation surface; and lower side surfaces in the track-width direction forming an inclination angle $\theta_U$ to said element formation surface,
   said inclination angle $\theta_S$ being greater than both of said inclination angles $\theta_C$ and $\theta_U$,
   a boundary between the upper side surface and the intermediate side surface where the inclination angle changes being located above a side surface of said magneto-sensitive portion in the track-width direction, and
   a boundary between the intermediate side surface and the lower side surface where the inclination angle changes being located below a side surface of said magneto-sensitive portion in the track-width direction.

4. The thin-film magnetic head as claimed in claim 3, wherein said free layer is made of a material selected from a group consisting of a CoFe alloy, a NiFe alloy, and a multilayer film of a CoFe alloy and a NiFe alloy, and wherein said cap layer is made of a Ta film.

5. A head gimbal assembly comprising:
   a thin-film magnetic head comprising at least one magnetoresistive effect element for reading data comprising:
   a substrate having an element formation surface;
   a lower electrode layer formed on said element formation surface;
   a foundation layer formed on said lower electrode layer;
   a magneto-sensitive portion formed on said foundation layer, having a pinned layer including an antiferromagnetic film, a free layer, and a non-magnetic intermediate layer sandwiched between said pinned layer and said free layer;
   a cap layer formed on said magneto-sensitive portion and made of a material having an ion beam etching rate lower than that of a material of said free layer;

an upper electrode layer formed on said cap layer; and
a bias layer formed on both side surfaces of said magneto-sensitive portion in a track-width direction with an insulating layer being provided between each of said side surface and said bias layer,
a multilayer which includes said foundation layer, said magneto-sensitive portion and said cap layer, having: upper side surfaces in the track-width direction forming an inclination angle $\theta_C$ to said element formation surface; intermediate side surfaces in the track-width direction forming an inclination angle $\theta_S$ to said element formation surface; and lower side surfaces in the track-width direction forming an inclination angle $\theta_U$ to said element formation surface,
said inclination angle $\theta_S$ being greater than both of said inclination angles $\theta_C$ and $\theta_U$,
a boundary between the upper side surface and the intermediate side surface where the inclination angle changes being located above a side surface of said magneto-sensitive portion in the track-width direction, and
a boundary between the intermediate side surface and the lower side surface where the inclination angle changes being located below a side surface of said magneto-sensitive portion in the track-width direction; and
a support structure for supporting said thin-film magnetic head.

6. The head gimbal assembly as claimed in claim 5, wherein said free layer is made of a material selected from a group consisting of a CoFe alloy, a NiFe alloy, and a multilayer film of a CoFe alloy and a NiFe alloy, and wherein said cap layer is made of a Ta film.

7. A magnetic recording and reproducing apparatus comprising:
at least one head gimbal assembly comprising:
a thin-film magnetic head comprising at least one magnetoresistive effect element for reading data comprising:
a substrate having an element formation surface;
a lower electrode layer formed on said element formation surface;
a foundation layer formed on said lower electrode layer;
a magneto-sensitive portion formed on said foundation layer, having a pinned layer including an antiferromagnetic film, a free layer, and a non-magnetic intermediate layer sandwiched between said pinned layer and said free layer;
a cap layer formed on said magneto-sensitive portion and made of a material having an ion beam etching rate lower than that of a material of said free layer;
an upper electrode layer formed on said cap layer; and
a bias layer formed on both side surfaces of said magneto-sensitive portion in a track-width direction with an insulating layer being provided between each of said side surface and said bias layer,
a multilayer which includes said foundation layer, said magneto-sensitive portion and said cap layer, having: upper side surfaces in the track-width direction forming an inclination angle $\theta_C$ to said element formation surface; intermediate side surfaces in the track-width direction forming an inclination angle $\theta_S$ to said element formation surface; and lower side surfaces in the track-width direction forming an inclination angle $\theta_U$ to said element formation surface,
said inclination angle $\theta_S$ being greater than both of said inclination angles $\theta_C$ and $\theta_U$,
a boundary between the upper side surface and the intermediate side surface where the inclination angle changes being located above a side surface of said magneto-sensitive portion in the track-width direction, and
a boundary between the intermediate side surface and the lower side surface being located below a side surface where the inclination angle changes of said magneto-sensitive portion in the track-width direction; and
a support structure for supporting said thin-film magnetic head;
at least one magnetic disk; and
a recording/reproducing means for controlling read and write operations of said thin-film magnetic head to said at least one magnetic disk.

8. The magnetic recording and reproducing apparatus as claimed in claim 7, wherein said free layer is made of a material selected from a group consisting of a CoFe alloy, a NiFe alloy, and a multilayer film of a CoFe alloy and a NiFe alloy, and wherein said cap layer is made of a Ta film.

* * * * *